United States Patent
Meehan et al.

(10) Patent No.: US 11,462,295 B2
(45) Date of Patent: Oct. 4, 2022

(54) MICROCHIP LEVEL SHARED ARRAY REPAIR

(71) Applicant: International Business Machines Corporation, Armonk, NY (US)

(72) Inventors: Timothy Meehan, Burlington, VT (US); Kirk D. Peterson, Jericho, VT (US); John B. DeForge, Barre, VT (US); William V. Huott, Holmes, NY (US); Uma Srinivasan, Poughkeepsie, NY (US); Hyong Uk Kim, South Burlington, VT (US); Michelle E. Finnefrock, Williston, VT (US); Daniel Rodko, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 16/845,259

(22) Filed: Apr. 10, 2020

(65) Prior Publication Data

US 2021/0319845 A1 Oct. 14, 2021

(51) Int. Cl.
*G11C 29/00* (2006.01)

(52) U.S. Cl.
CPC .................. *G11C 29/70* (2013.01)

(58) Field of Classification Search
CPC ......... G11C 29/70; G11C 29/72; G11C 29/76; G11C 29/808; G11C 2029/4402
See application file for complete search history.

(56) References Cited

U.S. PATENT DOCUMENTS

| 7,757,135 | B2 | 7/2010 | Nadeau-Dostie et al. |
| 7,895,782 | B2 | 3/2011 | Farrell |
| 8,381,052 | B2 | 2/2013 | Chickanosky et al. |
| 8,775,880 | B2 | 7/2014 | Singh et al. |
| 9,230,691 | B1 | 1/2016 | Boynapalli et al. |
| 2017/0184662 | A1* | 6/2017 | Varadarajan ........... G11C 29/44 |
| 2017/0278583 | A1* | 9/2017 | Raghuraman .......... G11C 29/44 |
| 2017/0309349 | A1 | 10/2017 | Mondal et al. |
| 2021/0313001 | A1* | 10/2021 | Jang .................... G11C 29/4401 |

FOREIGN PATENT DOCUMENTS

EP 1377981 A1 1/2004

OTHER PUBLICATIONS

G. Wang, X. Wang, X. Chen and S. Xue, "Test and Repair Flow for Shared BISR in Asynchronous Multi-processors," 2014 20th IEEE International Symposium on Asynchronous Circuits and Systems, Potsdam, Germany, 2014, pp. 105-107. (Year: 2014).*
Tseng et al., "ReBISR: A reconfigurable built-in self-repair scheme for random access memories in SOCs." IEEE transactions on very large scale integration (vlsi) systems 18.6 (2009): 921-932.

* cited by examiner

*Primary Examiner* — Cynthia Britt
(74) *Attorney, Agent, or Firm* — Patterson + Sheridan, LLP

(57) ABSTRACT

A system may include an integrated circuit having repair select bits coupled with a central repair register. The repair register may be configured to determine how to broadcast multiple repair actions to a group of repairable circuits. Inclusion of the repair register may function to reduce the total number of latches used to hold repair information.

20 Claims, 8 Drawing Sheets

| | SELECT BITS | \|\| REPAIRED CIRCUITS \|\| | | | | | | | |
|---|---|---|---|---|---|---|---|---|---|
| | | 0 | 1 | 2 | 3 | 4 | 5 | 6 | 7 |
| OPTION 0 | 00 | NONE | NONE | NONE | NONE | NONE | NONE | NONE | NONE |
| OPTION 1 | 01 | REP1 | REP2 | REP1 | REP2 | REP1 | REP2 | REP1 | REP2 |
| OPTION 2 | 10 | REP1 | REP1 | REP1 | REP2 | REP1 | REP1 | REP2 | REP2 |
| OPTION 3 | 11 | REP1 | REP1 | REP1 | REP1 | REP2 | REP2 | REP2 | REP2 |

Fig. 2

| | SELECT BITS | \multicolumn{8}{c|}{REPAIRED CIRCUITS} |
| | | 0 | 1 | 2 | 3 | 4 | 5 | 6 | 7 |
| --- | --- | --- | --- | --- | --- | --- | --- | --- | --- |
| OPTION 0 | 00 | NONE | NONE | NONE | NONE | NONE | NONE | NONE | NONE |
| OPTION 1 | 01 | REP1 | REP2 | REP1 | REP2 | REP1 | REP2 | REP1 | REP2 |
| OPTION 2 | 10 | REP1 | REP1 | REP1 | REP2 | REP1 | REP1 | REP2 | REP2 |
| OPTION 3 | 11 | REP1 | REP1 | REP1 | REP1 | REP2 | REP2 | REP2 | REP2 |

Fig. 4

MICROCHIP LEVEL SHARED ARRAY
REPAIR

BACKGROUND

The invention generally relates to integrated circuits, and more specifically, the invention relates to in-system repair of memory arrays on integrated circuits Integrated circuits typically contain memory arrays. Some memory arrays can be classified as redundant. Redundant arrays have spare wordlines or bitlines. In the event of a detection of a fail in the array during a manufacturing test, the redundant wordlines or bitlines can be substituted for failing wordlines or bitlines. The information that encodes the use of redundant elements for any particular memory array can be stored in a set of fuses, or latches, located remotely from the memory arrays themselves.

When the integrated circuit is powered-on, the fuse information is decoded and transferred to the memory arrays using a serial scan chain. The decoding and transferring can enable the required redundant word and bitlines in the memory arrays. At the conclusion of this procedure, the memory array operates as if it were manufactured without error.

However, the redundancy (e.g., spare wordlines and bitlines) provided by the latches can cause increases in test time and latch counts. For this reason, many conventional circuits do not provide repairability to relatively smaller areas that are presumed to have a lower probability for defects. The resultant absence of redundancy creates exposure to defect driven yield loss.

SUMMARY

According to one embodiment of the present invention, a method of repairing an integrated circuit element includes detecting a defective element of a plurality of elements of an integrated circuit and receiving select bits at a repair register in communication with the plurality of elements. The method further may include receiving a plurality of repair actions at the repair register and communicating one of the plurality of repair actions from the repair register to each of the plurality of elements, where a communicated repair action of the plurality of repair action is selected at the repair register in response to receiving the select bits.

According to another particular embodiment, a method of repairing an integrated circuit element includes detecting a defective element of a plurality of elements of an integrated circuit, receiving select bits at a plurality of decode logic modules in communication with the plurality of elements; receiving a plurality of repair actions at the plurality of decode logic modules; and communicating one of the plurality of repair actions from one of the plurality of decode logic modules to one of the plurality of elements, wherein a communicated repair action is selected at the decode logic module in response to receiving the select bits.

According to another particular embodiment of the invention, an apparatus includes a plurality of elements of an integrated circuit and a repair register in communication with the plurality of elements, where the repair register receives select bits and a plurality of repair actions, and where the repair register selects a repair action from among the plurality of repair actions in response to receiving the select bits and communicates the repair action to the element.

BRIEF DESCRIPTION OF THE SEVERAL
VIEWS OF THE DRAWINGS

FIG. 2 is a chart including a column of repair options corresponding to a column of potential select bits;

FIG. 4 is another chart including a column of repair options corresponding to a column of potential select bits (e.g., 2 bits);

Figure 5:
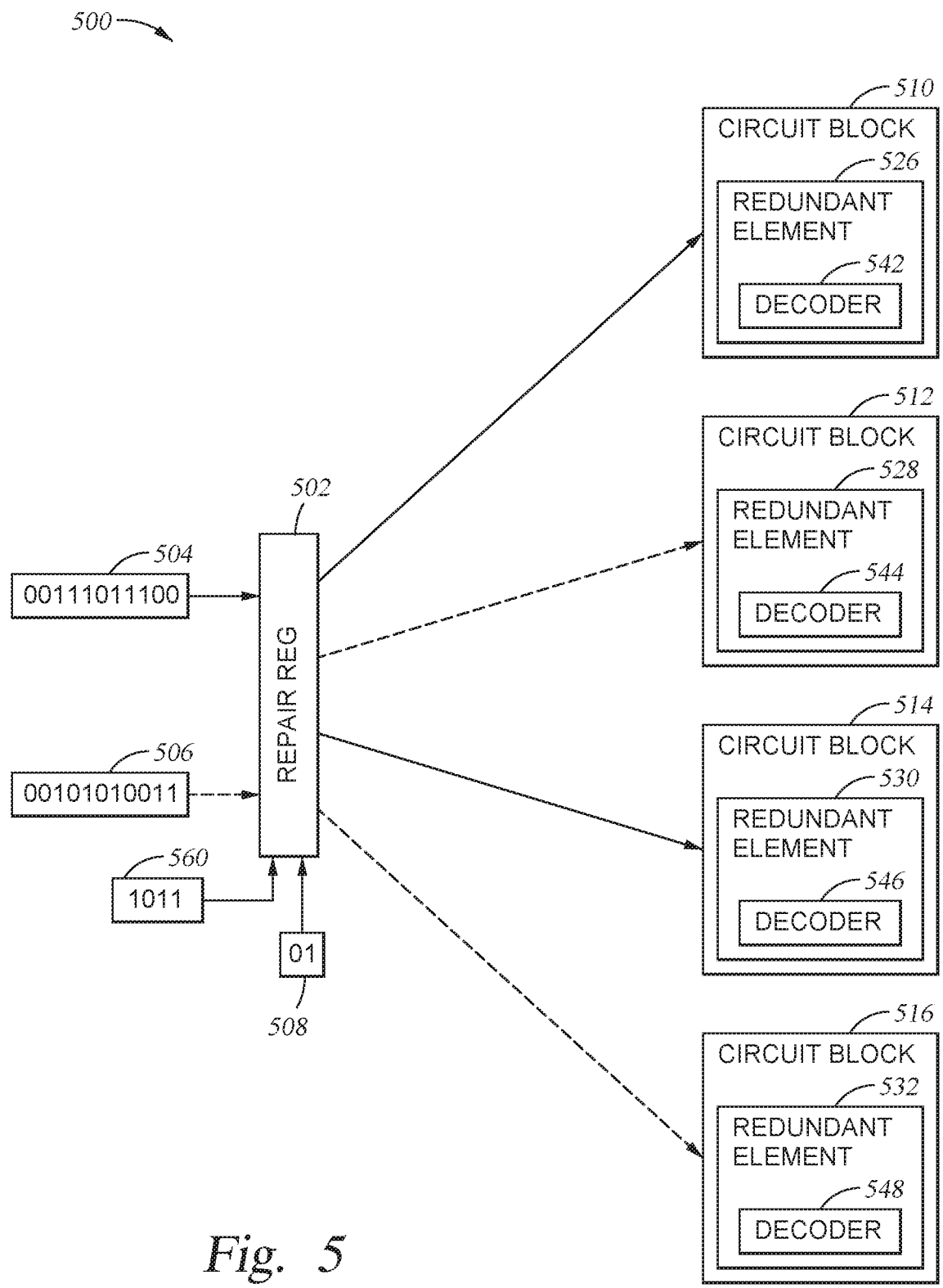
Figure 6:
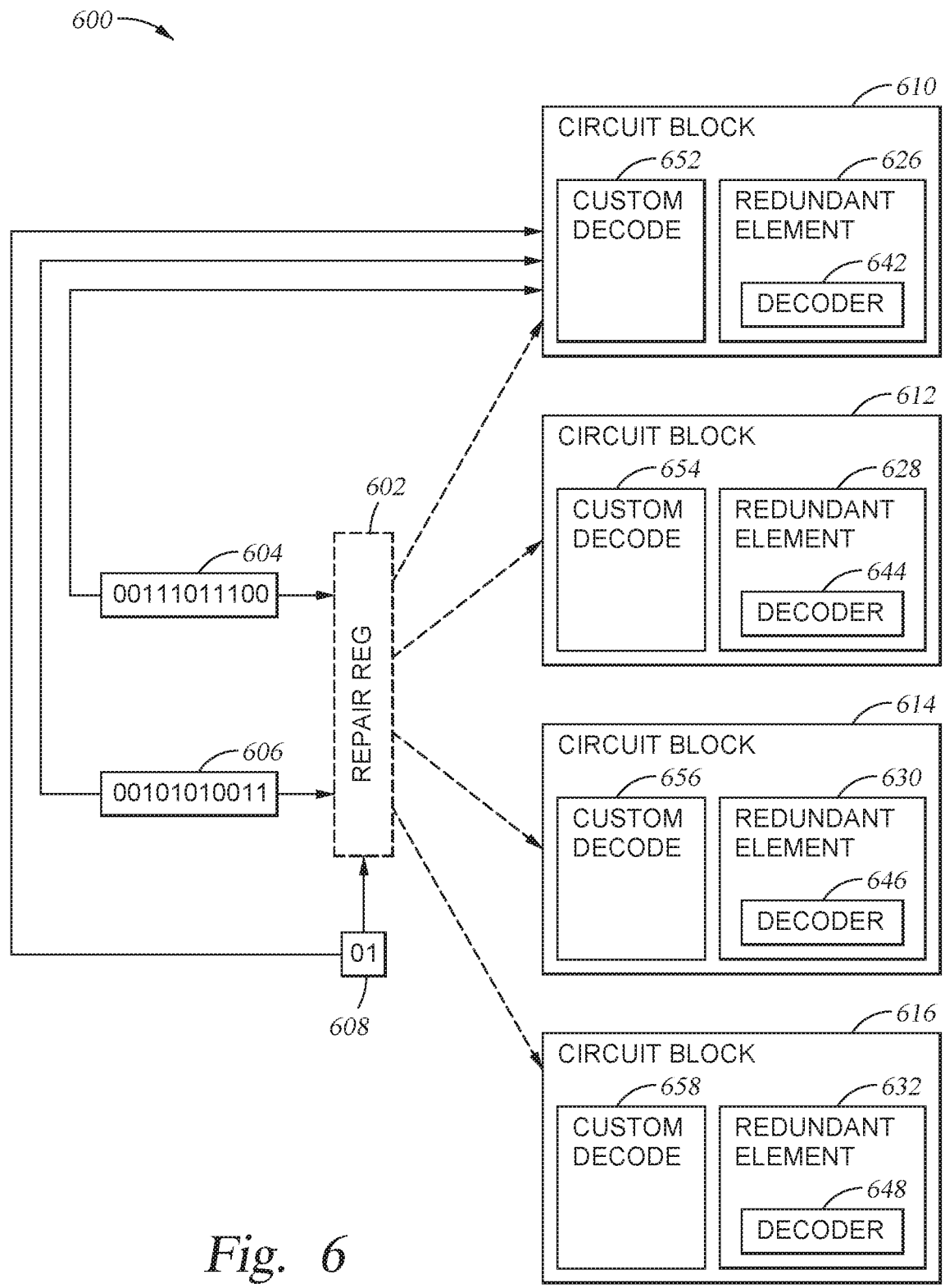
Figure 7:
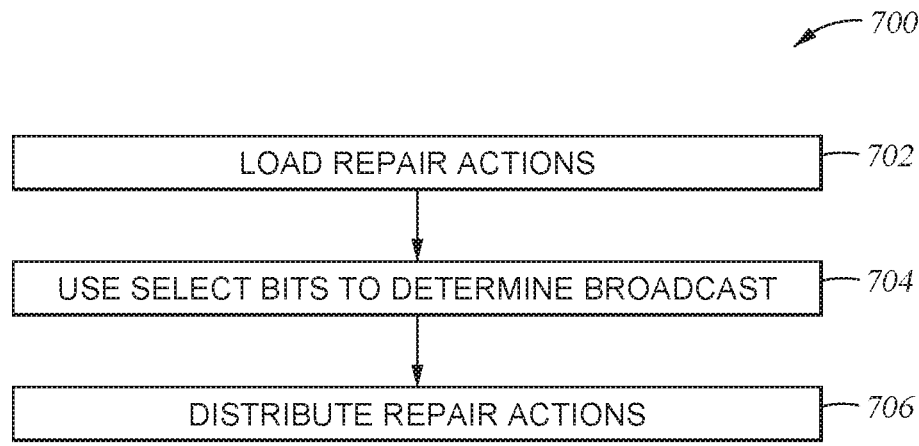
Figure 8:
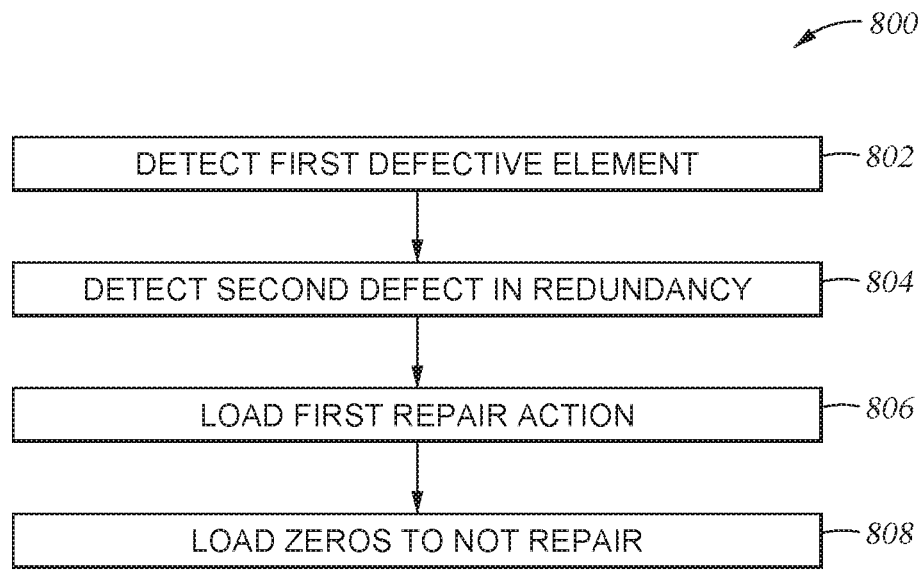
Figure 9:
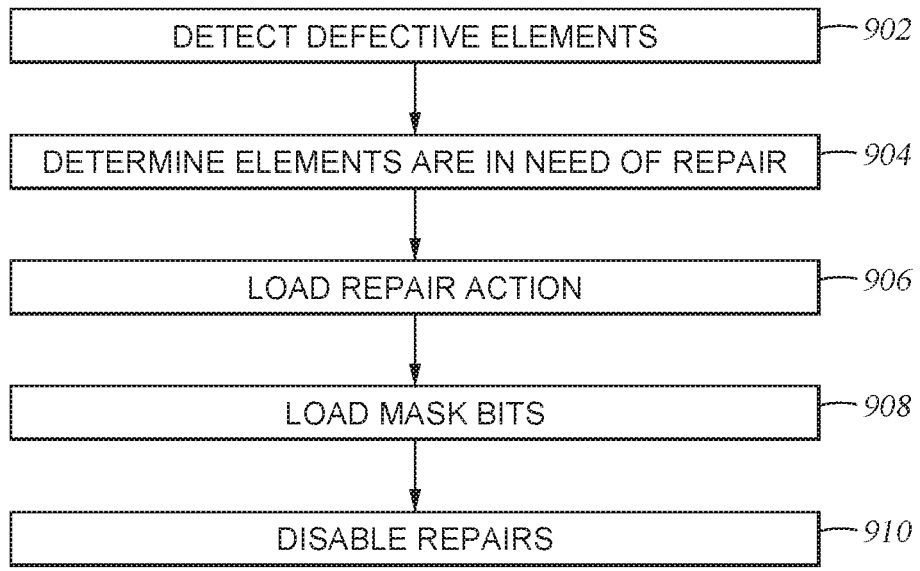
Figure 10:
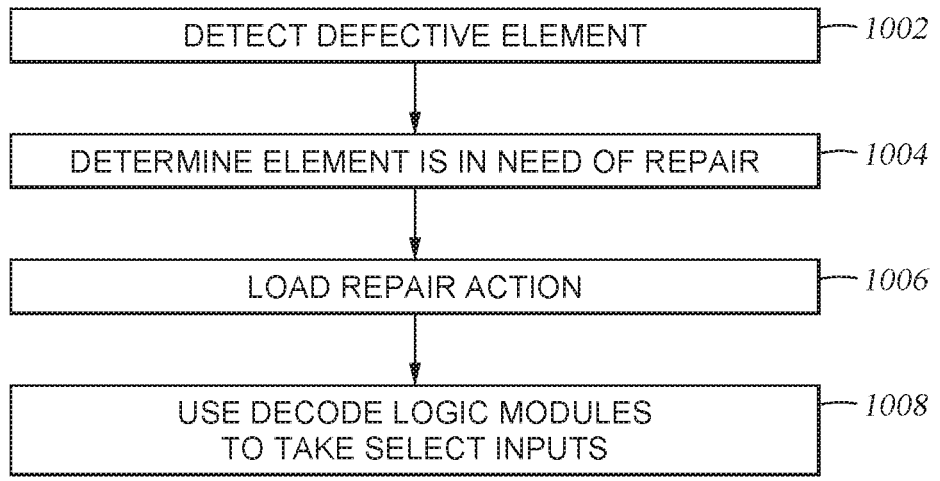

FIG. 5 shows another embodiment of a system that includes a repair register, as well as a detected bad redundant element of circuit block and mask bits; and FIG. 6 shows another embodiment of a system where the repair register is optional and having custom decode logic modules configured to execute instructions at each repairable circuit to determine which repair may be implemented based on repair select bits;

FIG. 7 is a flowchart comprising an embodiment of a method of repairing an array at the microchip level using a central repair register;

FIG. 8 is a flowchart comprising an embodiment of a method of repairing an array at the microchip level using a central repair register and a repair action comprising all zeros;

FIG. 9 is a flowchart comprising an embodiment of a method of repairing an array at the microchip level using a central repair register and masking bits; and FIG. 10 is a flowchart comprising an embodiment of a method of repairing an array at the microchip level using decoding modules positioned at each individual array.

DETAILED DESCRIPTION

An embodiment of a system may include an integrated circuit having repair select bits coupled with a central repair register. The repair register may be configured to determine how to broadcast multiple repair actions to a group of repairable circuits. Inclusion of the repair register may function to reduce the total number of latches used to hold repair information.

An embodiment of a circuit may include the repair register as configured to broadcast multiple repair actions to multiple random access memory macros. The distribution of the repairs may be controlled by an input signal. According to a particular embodiment of the system, the repair register for at least one repair may be set to all zeros. The all-zero setting may cause no repairs to be implemented on the receiving circuit. Such a selection may be due to the presence and detection of bad redundant elements.

According to another or the same embodiment, the repair register may include additional logic to decode a set of mask bits that disable the repairs going to the circuits. The disabling may be specified by the inclusion of a bit 0 in the mask set due to bad redundant elements. According to another or the same embodiment, the repair register may broadcast all repair instructions and n-select bits to repairable arrays or other circuits. The arrays may include additional decode logic configured to determine which repair instruction, or repair action, to apply.

Figure 1:
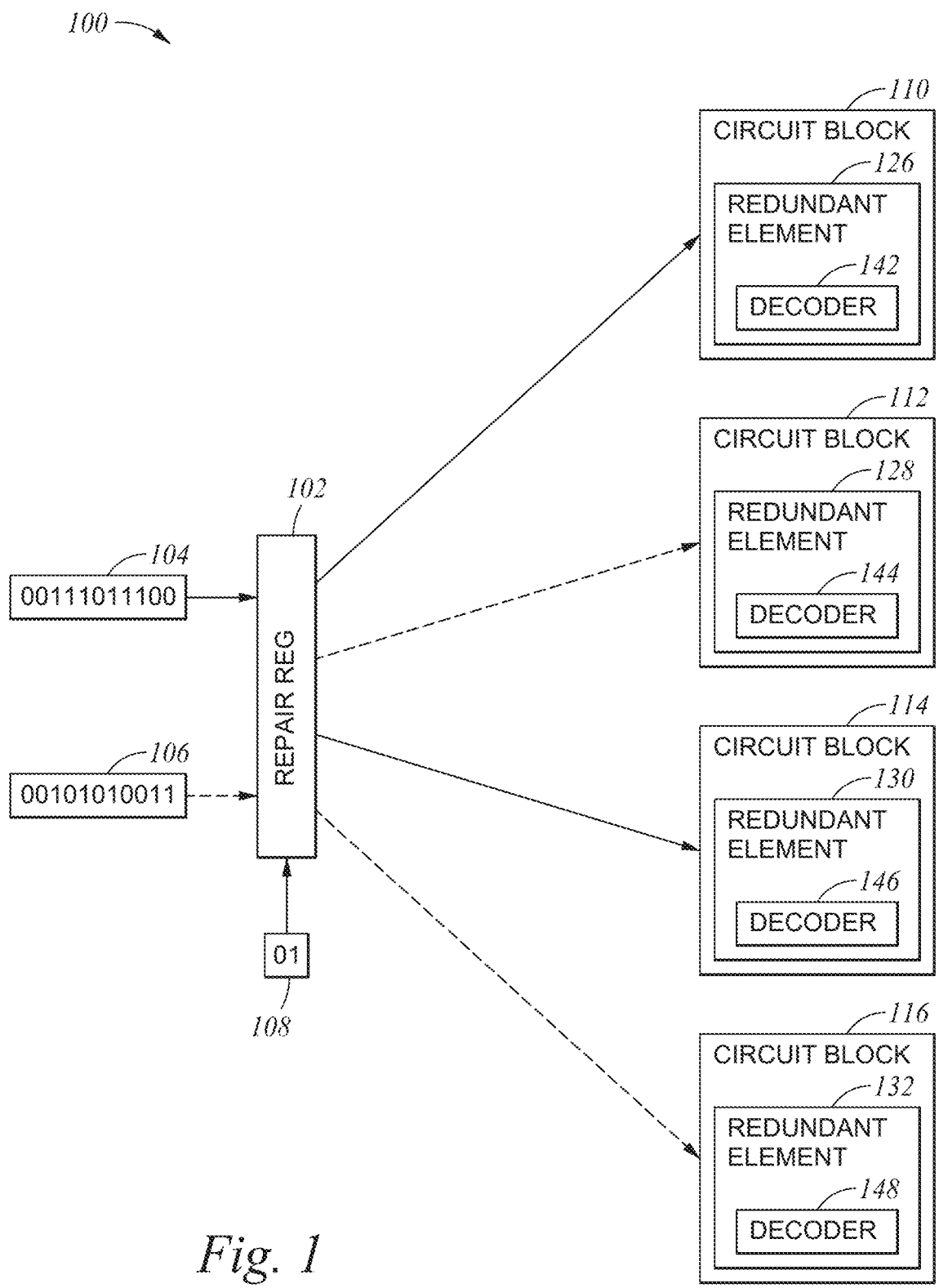
FIG. 1 shows an embodiment of a system that includes a repair register configured to receive inputs comprising repair actions.

FIG. 1 shows an embodiment of a system 100 that includes a repair register 102 configured to receive inputs comprising repair actions 104, 106. One skilled in the art should appreciate that more than the two repair actions 104, 106 may be loaded into a register of another embodiment of the system. Additionally, while arrays are shown in FIG. 1, another embodiment may alternatively include another type of repairable circuit, such as input and output (I/O), logic, and dynamic random access memory (DRAM).

The repair register 102 may additionally receive an input comprising select bits 108. The repair register 102 of an embodiment may be configured to communicate with circuit blocks 110, 112, 114, and 116. As shown in FIG. 1, the circuit blocks 110, 112, 114, 116 comprise arrays. Each of the circuit blocks 110, 112, 114, 116 may include redundant elements 126, 128, 130, 132 including decoders 142, 144, 146, 148 to receive the repair instructions 104, 106 from the repair register 102.

The repair register 102 may be configured to take n-select bits 108 as an input. The select bits 108 may determine which repair actions 104, 106 to distribute and how to distribute them to the group of circuit blocks 110, 112, 114, 116. In the example of FIG. 1, the N-select bits 108 determines which repair actions 104, 106 are sent to each array 110, 112, 114, and 116. In FIG. 1, the repair action 104 may be loaded into arrays 110, 114. The repair action 106 may be loaded into arrays 112, 116. A repair 104, 106 may always be loaded to all rays when a repair is needed on a single array 112 in the group of arrays 110, 112, 114, 116.

FIG. 2 is a chart 200 including a column of repair options 202 corresponding to a column of potential select bits (e.g., 2 bits) 204. The select bits 204 may comprise the select bits 108 of FIG. 1. Columns 206, 208, 210, 212, 214, 216, 218, 220 may correspond to arrays, such as the arrays/circuit blocks 110, 112, 114, 116 of FIG. 1. Row 222, which corresponds to select bits 00 in the chart 200, may result in no repairs for any of the arrays. Row 224, which corresponds to select bits 01 in the chart 200, may result in repair actions alternating between every other repaired circuit represented in columns 206, 208, 210, 212, 214, 216, 218, 220. In one example, REP1 may correspond to the repair action 104 of FIG. 1, and REP2 may correspond to the repair action 106. Row 226, which corresponds to select bits 10 in the chart 200, may result in repair actions alternating between every second repaired circuit represented in columns 206, 208, 210, 212, 214, 216, 218, 220. Row 228, which corresponds to select bits 11 in the chart 200, may result in repair actions alternating between every fourth repaired circuit represented in columns 206, 208, 210, 212, 214, 216, 218, 220.

In operation, the repair actions, such as the repair actions 104, 106 of FIG. 1, may be loaded into the repair register, such as the repair register 102 of FIG. 1. The select bits may be used to determine the broadcast to the circuits. For example, the select bits 108 of FIG. 1 may be used by the repair register 102 to determine the manner of the broadcast to the arrays 110, 112, 114, 116 of FIG. 1. The repair actions may be distributed to the circuits. For example, the repair actions 104, 106 of FIG. 1 may be distributed to the arrays 110, 112, 114, 116 of FIG. 1 according to the input of the select bits 108 at the repair register 102.

Figure 3:
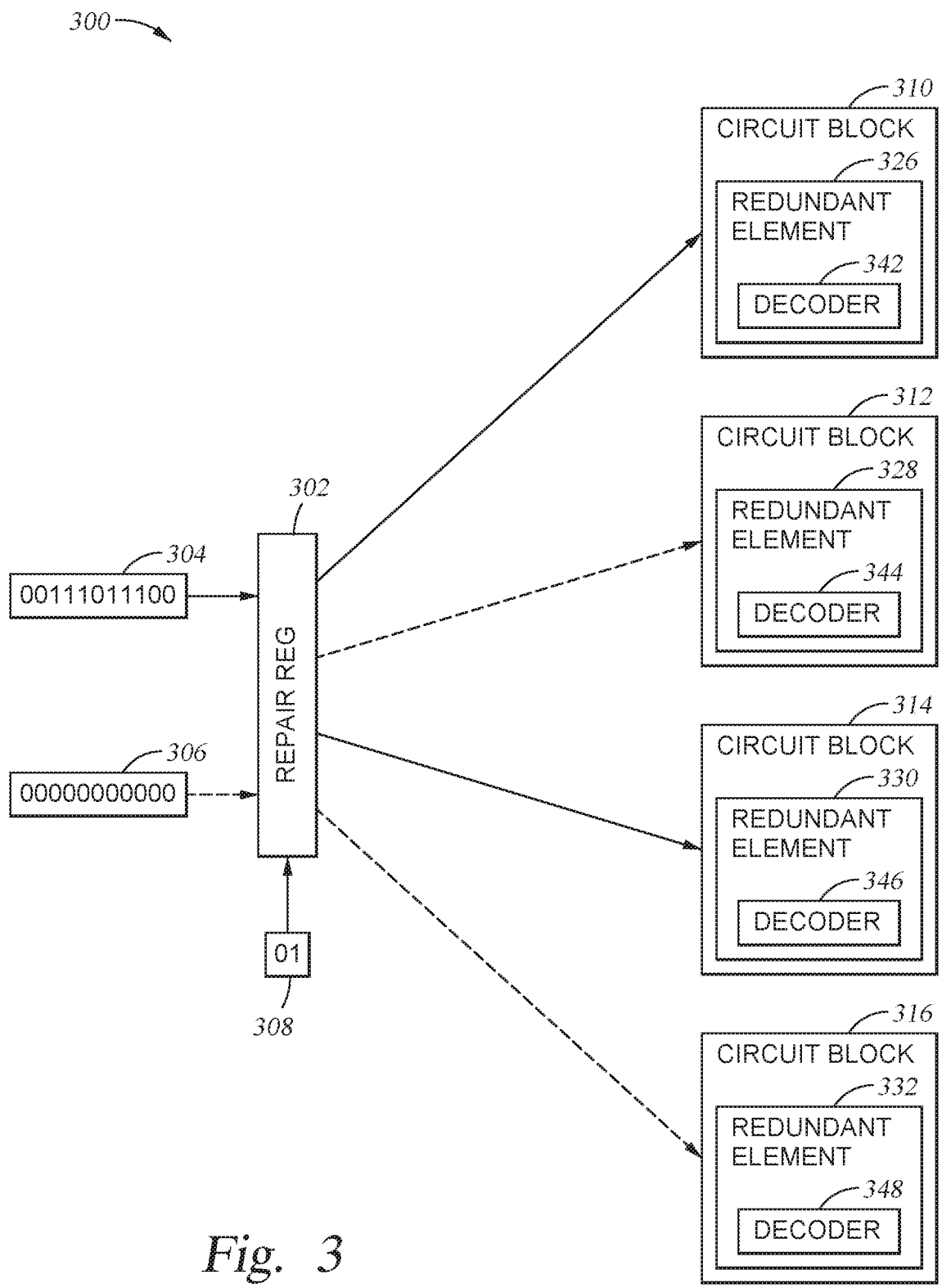
FIG. 3 shows another embodiment of a system that includes a repair register and a detected bad redundant element of circuit block.

FIG. 3 shows another embodiment of a system 300 that includes a repair register 302 and a detected bad redundant element of circuit block 312. That is, a defect may have been detected in the circuit block 312. The system 300 may additionally include a defective element located in circuit block 310 such that the circuit block 310 is in need of a repair.

The repair register 302 may be configured to receive inputs comprising repair actions 304, 306. As shown in FIG. 3, the repair action 306 comprises all zeros. The all zeros may instruct that no repair occurs. The repair register 302 may additionally receive an input comprising a repair select 308.

The repair register 302 of an embodiment may be configured to communicate with circuit blocks 310, 312, 314, and 316. As shown in FIG. 3, the circuit blocks may 310, 312, 314, 316 comprise arrays. Each of the circuit blocks 310, 312, 314, 316 may include redundant elements 326, 328, 330, 332 including decoders 342, 344, 346, 348 to receive the repair instructions 304, 306 from the repair register 302.

The repair register 302 may be configured to take n-select bits 308 as an input. The select bits 308 may determine which repair actions 304, 306 to distribute and how to distribute them to the group of circuit blocks 310, 312, 314, 316. In the example of FIG. 3, the N-select bits 308 determines which repair actions 304, 306 are sent to each array 310, 312, 314, and 316. In FIG. 3, the repair action 304 may be loaded into arrays 310 and 314. The repair action 306 may be loaded into arrays 312 and 316. A repair action 304, 306 may always be loaded to all rays when a repair is needed on a single array 312 in the group of arrays 310, 312, 314, 316.

In operation, the repair actions, a defective element may be detected in a circuit block. For example, the system 300 may detect a defective element in circuit block 310. As such, the system would determine that circuit block 310 is in need of a repair.

A defective redundant element may detected in circuit block 312. That is, a defect may be detected in the redundancy of circuit block 312. A repair action for the circuit block may loaded. For example, the repair register 302 of FIG. 3 may load the repair action 304 to circuit block 310.

The circuit block having the defective redundant element may be loaded with all zeros (e.g., corresponding to the second repair action). For instance, the repair register 302 may send repair action 306 to circuit block 312. This repair action may cause no repairs to be made. In this manner, the repair to circuit block having the defective element may be sent and effectuated, while the circuit block having the defective redundancy may not be used. For example, the repair to circuit block 310 may be sent and accomplished. The circuit block 312 having the defective redundancy may not be used.

FIG. 4 is a chart 400 including a column of repair options 402 corresponding to a column of potential select bits (e.g., 2 bits) 404. The select bits 404 may comprise the select bits 308 of FIG. 3. Columns 406, 408, 410, 412, 414, 416, 418, 420 may correspond to arrays, such as the arrays 310, 312, 314, 316 of FIG. 3. Row 422, which corresponds to select bits 00 in the chart 400, may result in no repairs for any of the arrays. Row 424, which corresponds to select bits 01 in the chart 400, may result in repair actions alternating between every other repaired circuit represented in columns 406, 408, 410, 412, 414, 416, 418, 420. Row 426, which corresponds to select bits 10 in the chart 400, may result in repair actions alternating between every second repaired circuit represented in columns 406, 408, 410, 412, 414, 416, 418, 420. Row 428, which corresponds to select bits 11 in the chart 400, may result in repair actions alternating between every fourth repaired circuit represented in columns 406, 408, 410, 412, 414, 416, 418, 420.

FIG. 5 shows another embodiment of a system 500 that includes a repair register 502, as well as a detected bad redundant element of circuit block 512 and mask bits 560. That is, a defect may have been detected in the circuit block 512. The system 500 may additionally include a defective element located in circuit block 510 such that the circuit block 510 is in need of a repair.

The repair register 502 may be configured to receive inputs comprising repair actions 504, 506 and the mask bits 560. The repair register 502 may additionally receive an input comprising repair select bits 508.

In operation, a defective element may be detected in a circuit block. For example, the system 500 may detect a defective element in circuit block 510. As such, the system would determine that circuit block 510 is in need of a repair.

A defective redundant element may detected in circuit block 512. That is, a defect may be detected in the redundancy of circuit block 512. A repair action for the circuit block may loaded. For example, the repair register 502 of FIG. 5 may load the repair action 504 to circuit block 510. Repairs may be loaded. For instance, repair action 504 may be loaded to circuit blocks 510, 514. The repair action 506 may be sent to circuit block 514. The mask bits 560 may be loaded to circuit board 512. No repair action may occur at circuit block 516. The mask bits 560 at position 1 may have a value of zero. The repair register 502 may include additional logic to decode the set of mask bits 560. The mask bits 560 may be configured to disable the repairs going to the circuits specified by a bit 0 in the set of mask bits 560 due to bad redundant elements The repair register 502 of the embodiment of FIG. 5 may be configured to communicate with the circuit blocks 510, 512, 514, and 516. As shown in FIG. 5, the circuit blocks 510, 512, 514, 516 comprise arrays. Each of the circuit blocks 510, 512, 514, 516 may include redundant elements 526, 528, 530, 532 including decoders 542, 544, 546, 548 to receive the repair instructions 504, 506 from the repair register 502.

The repair register 502 may be configured to take n-select bits 508 as an input. The select bits 508 and mask bits 560 may determine which repair actions 504, 506 to distribute and how to distribute them to the group of circuit blocks 510, 512, 514, 516. In the example of FIG. 5, the N-select bits 508 and mask bits 560 may determine which repair actions 504, 506 are sent to each array 510, 512, 514, and 516.

FIG. 6 shows another embodiment of a system 600 where the repair register 602 (denoted in a dashed lines) is optional and having custom decode logic modules 652, 654, 656, 658 configured to execute instructions at each repairable circuit to determine which repair may be implemented based on repair select bits 608. The repair actions 604, 606 and repair select bits 608 may be received by all decode logic blocks in a group sharing repair instructions.

The decode logic modules 652, 654, 656, 658 (or the repair register 602) may be configured to receive inputs comprising the repair actions 604, 606. The decode logic modules 652, 654, 656, 658 (or the repair register 602) may additionally receive an input comprising a repair select 608.

In operation, a defective element may be detected in a circuit block. For example, the system 600 may detect a defective element in circuit block 610. As such, the system would determine that circuit block 610 is in need of a repair.

A defective redundant element may detected in circuit block 612. That is, a defect may be detected in the redundancy of circuit block 612. A repair action for the circuit block may loaded. For example, the decode logic module 652 (or the repair register 602) of FIG. 6 may load the repair action 604 to circuit block 610. Repairs may be loaded. For instance, repair action 604 may be loaded to circuit blocks 610, 614. The repair action 606 may be sent to 614.

The repair register 602 of the embodiment of FIG. 6 may be configured to communicate with the circuit blocks 610, 612, 614, and 616. As shown in FIG. 6, the circuit blocks 610, 612, 614, 616 comprise arrays. Each of the circuit blocks 610, 612, 614, 616 may include redundant elements 626, 628, 630, 632 including decoders 642, 644, 646, 648 to receive the repair instructions 604, 606 from the decode logic modules 652, 654, 656, 658 (or the repair register 602).

The decode logic modules 652, 654, 656, 658 (or the repair register 602) may be configured to take n-select bits 608 as an input. The select bits 608 may determine which repair actions 604, 606 to distribute and how to distribute them to the group of circuit blocks 610, 612, 614, 616. In the example of FIG. 6, the N-select bits 608 may determine which repair actions 604, 606 are sent to each array 610, 612, 614, and 616.

FIG. 7 is a flowchart comprising an embodiment of a method 700 of repairing an array at the microchip level using a central repair register. At 702, repair actions, such as the repair actions 104, 106 of FIG. 1, may be loaded into the repair register, such as the repair register 102 of FIG. 1.

The select bits may be used to determine the broadcast to the circuits at 704. For example, the select bits 108 of FIG. 1 may be used by the repair register 102 to determine the manner of the broadcast to the elements, or arrays 110, 112, 114, 116 of FIG. 1.

The repair actions may be distributed to the circuits at 706. For example, the repair actions 104, 106 of FIG. 1 may be distributed to the arrays 110, 112, 114, 116 of FIG. 1 according to the input of the select bits 108 at the repair register 102.

FIG. 8 is a flowchart comprising an embodiment of a method of 800 of repairing an array at the microchip level using a central repair register and a repair action comprising all zeros. At 802 a defective element may be detected in a circuit block. For example, the system 300 may detect a defective element in circuit block 310. As such, the system would determine that circuit block 310 is in need of a repair.

At 804, a defective redundant element may detected in a circuit block. For instance, a defect may be detected in the redundancy of circuit block 312 of FIG. 3.

A repair action for the circuit block may loaded at 806. For example, the repair register 302 of FIG. 3 may load the repair action 304 to circuit block 310.

The circuit block having the defective redundant element may be loaded at 808 with all zeros (e.g., corresponding to the second repair action). For instance, the repair register 302 may send repair action 306 to circuit block 312. This repair action may cause no repairs to be made. In this manner, the repair to circuit block having the defective element may be sent and effectuated, while the circuit block having the defective redundancy may not be used. For example, the repair to circuit block 310 may be sent and accomplished. The circuit block 312 having the defective redundancy may not be used.

FIG. 9 is a flowchart comprising an embodiment of a method 900 of repairing an array at the microchip level using a central repair register and masking bits. In operation, a defective element may be detected in a circuit block at 902. For example, the system 500 may detect a defective element in circuit block 510. As such, the system would determine that circuit block 510 is in need of a repair at 904.

A defective redundant element may detected in circuit block 512. That is, a defect may be detected in the redundancy of circuit block 512. A repair action for the circuit block may loaded. For example, the repair register 502 of FIG. 5 may load the repair action 504 to circuit block 510. Additionally, a repair action 504 may be loaded to circuit blocks 510, 514.

Mask bits 560 may be loaded to circuit board 512. As described in the earlier example, a mask bit at position 1 may have a value of zero. The repair register 502 of FIG. 5 may include additional logic to decode the set of mask bits 560. The mask bits 560 may be configured to disable the repairs going to the circuits specified by a bit 0 in the set of mask bits 560 due to bad redundant elements FIG. 10 is a flowchart comprising an embodiment of a method of 1000 of repairing an array at the microchip level using decoding modules positioned at each individual array. At 1002, a defective element may be detected in a circuit block. For example, the system 600 may detect a defective element in circuit block 610. As such, the system would determine at 1004 that circuit block 610 is in need of a repair.

Repairs may be loaded at 1006. For instance, repair action 604 may be loaded to circuit blocks 610, 614. The repair action 606 may be sent to 614.

Decode logic modules 652, 654, 656, 658 (or a repair register 602) may be configured to take at 1008 n-select bits 608 as an input. The select bits 608 may determine which repair actions 604, 606 to distribute and how to distribute them to the group of circuit blocks 610, 612, 614, 616. In the example of FIG. 6, the N-select bits 608 may determine which repair actions 604, 606 are sent to each array 610, 612, 614, and 616.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method of repairing an integrated circuit element, the method comprising:
   detecting a defective element of a plurality of elements of an integrated circuit;
   receiving select bits at a repair register in communication with the plurality of elements;
   receiving a plurality of repair actions at the repair register; and
   communicating one of the plurality of repair actions from the repair register to each of the plurality of elements, wherein a communicated repair action of the plurality of repair action is selected at the repair register in response to receiving the select bits.

2. The method of claim 1, further comprising broadcasting multiple repair actions to multiple random access memory macros using the repair register.

3. The method of claim 1, further comprising receiving an input signal at the repair register, wherein a distribution of the plurality of repair actions is controlled by the input signal.

4. The method of claim 1, wherein the communicated repair action is set to all zeros.

5. The method of claim 4, wherein the communicated repair action causes no repair to be implemented on the integrated circuit element due to bad redundant elements.

6. The method of claim 1, further comprising decoding a set of mask bits that disables the repair action.

7. The method of claim 6, wherein the mask bits are used in connection with a bad redundant element.

8. The method of claim 1, further comprising a plurality of decode logic modules to receive the plurality of repair actions, wherein the plurality of decode logic modules determine which repair action to apply.

9. A method of repairing an integrated circuit element, the method comprising:
   detecting a defective element of a plurality of elements of an integrated circuit;
   receiving select bits at a plurality of decode logic modules in communication with the plurality of elements;
   receiving a plurality of repair actions at the plurality of decode logic modules; and
   communicating one of the plurality of repair actions from one of the plurality of decode logic modules to one of the plurality of elements, wherein a communicated repair action is selected at the decode logic module in response to receiving the select bits.

10. The method of claim 9, further comprising receiving an input signal at the repair register, wherein a distribution of the plurality of repair actions is controlled by the input signal.

11. The method of claim 9, wherein the communicated repair action causes no repair to be implemented on the integrated circuit element.

12. The method of claim 9, further comprising decoding a set of mask bits that disables the repair action.

13. An apparatus comprising:
   a plurality of elements of an integrated circuit; and
   a repair register in communication with the plurality of elements, wherein the repair register receives select bits and a plurality of repair actions, and wherein the repair register selects a repair action from among the plurality of repair actions in response to receiving the select bits and communicates the repair action to the element.

14. The apparatus of claim 13, wherein the repair register is further configured to broadcast multiple repair actions to multiple random access memory macros.

15. The apparatus of claim 13, wherein the repair register is further configured to receive an input signal, wherein a distribution of the plurality of repair actions is controlled by the input signal.

16. The apparatus of claim 13, wherein the communicated repair action is set to all zeros.

17. The apparatus of claim 16, wherein the communicated repair action causes no repair to be implemented on the integrated circuit element due to bad redundant elements.

18. The apparatus of claim 13, further comprising a set of mask bits that are decoded to disable the repair action.

19. The apparatus of claim 13, further comprising a plurality of decode logic modules to receive the plurality of repair actions, wherein the plurality of decode logic modules determine which repair action to apply.

20. The apparatus of claim 13, wherein the repair register is configured to detect a bad redundant element and initiate no repair.

* * * * *